United States Patent [19]

Arita

[11] 3,874,955

[45] Apr. 1, 1975

[54] METHOD OF MANUFACTURING AN MOS INTEGRATED CIRCUIT

[75] Inventor: Shigeru Arita, Ibaragi, Japan

[73] Assignee: Matsushita Electronics Corporation, Osaka, Japan

[22] Filed: Mar. 15, 1973

[21] Appl. No.: 341,493

[30] Foreign Application Priority Data

Mar. 17, 1972 Japan .......................... 47-27785

[52] U.S. Cl. .................... 148/187, 29/571, 29/577, 29/578, 357/23, 357/45, 357/51, 357/86

[51] Int. Cl. ....... H01l 7/44, H01l 27/10, B01j 17/00

[58] Field of Search ........... 148/187; 317/235, 357; 29/571, 577, 578

[56] References Cited

UNITED STATES PATENTS

| | | | |
|---|---|---|---|
| 3,387,286 | 6/1968 | Dennard | 317/235 G X |
| 3,408,543 | 10/1968 | Ono et al. | 317/235 |
| 3,604,107 | 9/1971 | Fassett | 29/571 |
| 3,740,732 | 6/1973 | Frandon | 317/235 Q X |
| 3,745,383 | 7/1973 | Sangster | 317/235 G X |
| 3,747,200 | 7/1973 | Rutledge | 29/571 |

OTHER PUBLICATIONS

Ho et al., "Single–Electrode One–Device Cell," IBM Tech. Discl. Bull., Vol. 15, No. 6, Nov. 1972, p. 1765–1766.

*Primary Examiner*—L. DeWayne Rutledge
*Assistant Examiner*—W. G. Saba
*Attorney, Agent, or Firm*—Stevens, Davis, Miller & Mosher

[57] ABSTRACT

A method of manufacturing an MOS integrated circuit by utilizing a self-alignment technique is provided, wherein a capacitor is fabricated independently of other circuit elements. The capacitor is composed of a preliminary diffused region, a silicon dioxide layer and a gate electrode section having at least a portion thereof laid on top of the preliminary diffused region. The capacitor produced in accordance with this method is positively separated from other circuit elements and it may be used, for example, as an auxiliary storage capacitor for an inverter circuit to prevent the lowering of the output signal.

2 Claims, 5 Drawing Figures

METHOD OF MANUFACTURING AN MOS INTEGRATED CIRCUIT

The present invention relates to a method of manufacturing an MOS integrated circuit of the type which is suitable for fabricating therein a capacitor for an auxiliary storage circuit that may be used in an MOS integrated circuit including an inverter circuit and the like.

FIG. 1 of the accompanying drawings shows one form of known inverter circuit of this type. In the figure, numeral 1 designates an inverter transistor, 2 a load transistor, 3 a storage capacitor, 4 a signal input terminal, 5 an output terminal, and 6 a DC bias supply terminal.

As is well known in the art, an inverter circuit constructed of MOS field-effect transistors comprises an inverter transistor and a load transistor.

In this circuit, the inverter operation is performed in which when the level of the signal applied to the input terminal 4 becomes high so that the inverter transistor 1 is cut off (in the case of P-channel enhancement mode MOS field-effect transistors), the nonconduction of this transistor causes the capacitor 3 to be charged through the load transistor 2, thereby producing an output signal at the output terminal 5.

In this case, however, the level of the output signal thus obtained, i.e., the voltage on the capacitor 3 inevitably drops below the level of the DC voltage applied to the DC bias supply terminal 6.

For instance, if V represents the DC voltage applied to the DC bias supply terminal 6 and VA represents the voltage at a point A, VA is given by the following equation:

$$VA = V - V_{th} - \Delta V_{th} \quad (1)$$

where $V_{th}$ is the threshold voltage of the load transistor 2 and $\Delta V_{th}$ is the change of $V_{th}$ due to the bulk effect of the load transistor 2.

In other words, the output level of the output signal drops by a voltage value corresponding to the sum of $V_{th}$ and $\Delta V_{th}$.

As an effective means to solve this problem of insufficient output voltage, the addition of an auxiliary storage circuit as shown in FIG. 2 of the accompanying drawings has been proposed. In FIG. 2, this auxiliary storage circuit is composed of a capacitor 7 and an MOS field-effect transistor 8. The addition of this circuit prevents the lowering of the output voltage according to the operating principle which will be explained hereunder.

Namely, when the level of an input signal applied to the gate of the inverter transistor 1 is low so that the inverter transistor is turned on, the capacitor 7 is charged through the MOS field-effect transistor 8 and therefore the potential at a point B is lower than the voltage applied to the terminal 6 by the value of the threshold voltage ($V_{th}'$) of the MOS field-effect transistor 8.

If the potential at the point B is represented as VB, then it is given as:

$$VB = V - V_{th}' \quad (2)$$

where V is the voltage applied to the terminal 6.

When the level of the signal applied to the gate of the inverter transistor 1 becomes high so that the transistor 1 is cut off and the capacitor 3 is thus charged, the load transistor 2 is in an unsaturated state and moreover the potential at the point B becomes higher than the voltage on the capacitor 3 by the value of VB as the charging of the capacitor 3 proceeds. In other words, as the charging of the capacitor 3 proceeds, the potential at the point B becomes higher than the voltage at the terminal 6 and eventually the capacitor 3 is charged up to the voltage V at the terminal 6.

In this way, the problem of decreased output level has been overcome by the provision of the auxiliary storage circuit.

However, there is a drawback in that if circuits of this kind are fabricated by the integrated circuit technology, particularly using the self-alignment technique, it is practically impossible to fabricate the capacitor 7 for the auxiliary storage circuit.

The self-alignment technique is a method of fabricating MOS field-effect transistors which is suitable for improving the frequency characteristic of circuits, and the technique will be explained hereunder with reference to FIG. 3 of the accompanying drawings.

FIG. 3 is a cross-sectional view of an MOS field-effect transistor fabricated by the self-alignment technique. In the figure, numeral 9 designates a silicon substrate, 10 and 11 gate oxide films, 12 and 13 gate electrodes made of molybdenum, for example, 14, 15 and 16 diffused regions formed by diffusing impurities into the silicon substrate, using the gate sections as masks, and being of a conductivity type opposite to that of the silicon substrate, 17 a silicon dioxide layer. Namely, in this process the diffused regions for providing source and drain regions are formed by utilizing the masking effect of the gate sections.

In this connection, as will be seen from FIG. 2, the ends of the capacitor in the auxiliary storage circuit are not directly connected to the grounded points. On the other hand, as will be seen from FIG. 3, with the circuit elements formed by the self-alignment technique, the gate electrode, the gate oxide film and the silicon substrate must be utilized to form the capacitor and in the actual use of the capacitor thus obtained, one end of the capacitor is necessarily grounded since the silicon substrate is grounded.

In other words, it is impossible to fabricate an auxiliary storage capacitor of the type shown in FIG. 2.

It is therefore a general object of the present invention to overcome the foregoing difficulty.

It is a specific object of the present invention to provide an improved method of manufacturing an MOS integrated circuit wherein a preliminary diffused region of a conductivity type opposite to that of a silicon substrate is formed prior to the formation of gate sections, whereby when an MOS field-effect transistor is fabricated utilizing the conventional self-alignment technique, an auxiliary storage capacitor is formed by the preliminary diffused region and the gate section associated therewith.

According to the method of this invention, while utilizing the self-alignment technique, a capacitor may be formed in a silicon substrate independently of the latter.

Other objects and advantages of the present invention will become readily apparent from considering the following detailed description taken in conjunction with the accompanying drawings, in which.

While the present invention will now be explained by taking the case of an auxiliary storage circuit in an inverter circuit, the present invention may be used extensively in applications where a capacitor whose ends will not be grounded, must be fabricated in an MOS integrated circuit.

Figure 4:
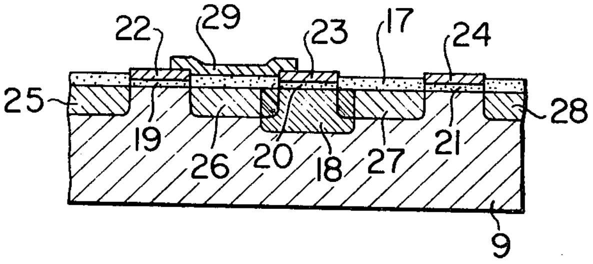
FIG. 4 is a cross-sectional view showing one form of a capacitor fabricated by a manufacturing method according to the present invention.
Figure 5:
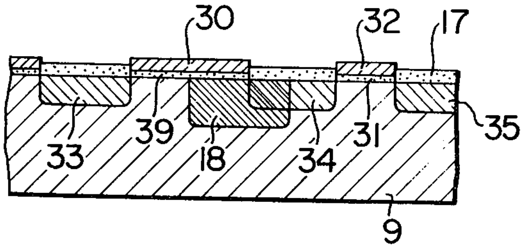
FIG. 5 is a cross-sectional view showing another form of the capacitor fabricated by the method according to the present invention.

Referring now to FIGS. 4 and 5, the present invention will be explained.

FIG. 4 is a cross-sectional view showing one form of a capacitor fabricated by the method according to the present invention. In the figure, numeral 18 designates a diffused region preliminarily diffused into a silicon substrate.

Following the formation of this diffused region, as shown in FIG. 4, gate oxide films 19, 20 and 21 are formed and then gate electrodes 22, 23 and 24 are formed respectively on the gate oxide films 19, 20 and 21.

In the formation of these gate sections, it is essential that at least a portion of the gate section is placed on the diffused region which has been preliminarily formed.

Then diffused regions 25, 26, 27 and 28 are formed to provide the necessary source and drain regions.

When these processing steps have been completed, a capacitor composed of the diffused region 18, the gate oxide film 20 and the gate electrode 23 is formed in the silicon substrate in addition to a plurality of MOS field-effect transistors. As is apparent already, the capacitor thus formed does not include any portion of the silicon substrate as its constituent element and it is therefore independent of the silicon substrate.

Figure 1:
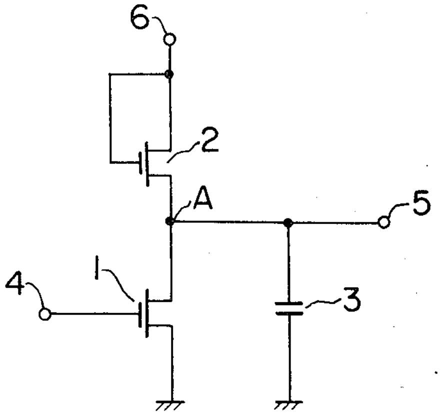
FIG. 1 PRIOR ART
FIG. 1 is a circuit diagram of a prior art inverter circuit constructed of MOS field-effect transistors.
Figure 2:
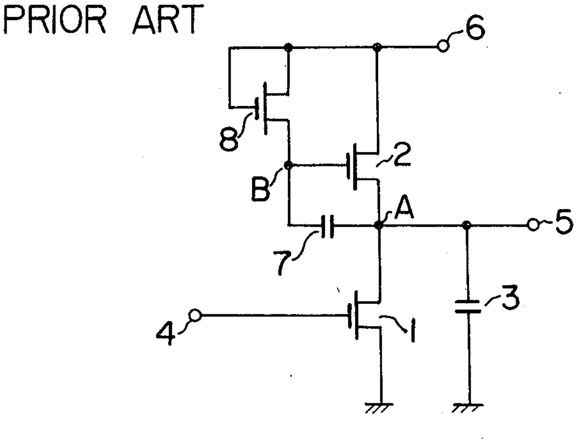
FIG. 2 PRIOR ART
FIG. 2 is a circuit diagram of a modified form of the inverter circuit of FIG. 1, including an auxiliary storage circuit.
Figure 3:
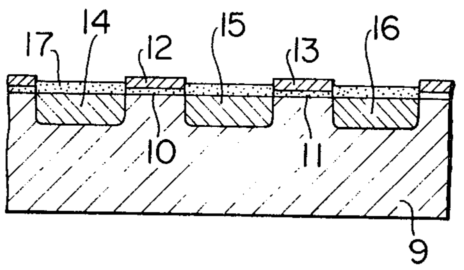
FIG. 3 PRIOR ART
FIG. 3 is a cross-sectional view for explaining a convenetional manufacturing method of MOS field-effect transistors by the self-alignment technique.

In FIG. 4, if it is assumed that the gate oxide film 19, the gate electrode 22 and the diffused regions 25 and 26 correspond to the load transistor of FIG. 2 and that the gate oxide film 21, the gate electrode 24 and the diffused regions 27 and 28 correspond to the inverter transistor of FIG. 2, the drain-source circuits of the two transistors are connected in cascade through the diffused region 18. In this case, since the diffused region 18 constitutes one end of the capacitor and the gate electrode 23 constitutes the other end of the capacitor, the gate electrode 23 and the gate electrode 22 may be interconnected by a conductive layer 29 to provide the same circuit connection as the capacitor in the auxiliary storage circuit shown in FIG. 2.

Further, a capacitor having a structure as shown in FIG. 5 may be fabricated by utilizing the method according to the present invention.

In other word, a gate oxide film 39 and a gate electrode 30 are arranged on the diffused region 18 in a structure shown in FIG. 5. In the figure, numerals 31 and 32 designate respectively a gate oxide film and a gate electrode constituting another gate section.

Then, utilizing the masking effect of the gate sections, impurities are diffused to form diffused regions 33, 34 and 35.

In the thus obtained device shown in FIG. 5, an MOS field-effect transistor is formed by the gate oxide film 39, the gate electrode 30 and the diffused regions 33 and 34 and another MOS field-effect transistor is formed by the gate oxide film 31, the gate electrode 32 and the diffused regions 34 and 35.

Further, a capacitor is provided by the diffused region 18, the gate oxide film 39 and the gate electrode 30.

In this structure, the diffused region 34 constituting the drain and source regions of the two MOS field-effect transistors is connected to the gate electrode 30 of one of the MOS field-effect transistors without providing any special connecting means.

What we claim is:

1. A method of manufacturing an MOS integrated circuit by utilizing the self-alignment technique comprising the steps of: forming into a preselected portion of a silicon substrate of one semiconductivity type of preliminary diffused region of the other semiconductivity type opposite to that of said silicon substrate; forming at least one gate section composed of a gate oxide film and a gate electrode on said silicon substrate so that at least a portion of said gate section associated with said preliminary diffused region is placed on said preliminary diffused region; and forming a plurality of diffused regions so that drain region and source region are provided on the sides of each of said gate sections, whereby each of said gate sections, together with said drain and source regions on the sides thereof, forms an MOS field-effect transistor, and said preliminary diffused region and said gate section placed thereon form a capacitor.

2. A method according to claim 1, wherein said MOS integrated circuit, is an inverter circuit, and said capacitor is an auxiliary storage capacitor for said inverter circuit.

* * * * *